(12) United States Patent
Nishizaka et al.

(10) Patent No.: US 9,774,075 B2
(45) Date of Patent: Sep. 26, 2017

(54) ELECTRONIC DEVICE

(71) Applicant: KYOCERA CORPORATION, Kyoto-shi, Kyoto (JP)

(72) Inventors: Naoki Nishizaka, Sagamihara (JP); Daisuke Togashi, Yokohama (JP); Motonori Imamura, Yokohama (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 14/761,615

(22) PCT Filed: Dec. 25, 2013

(86) PCT No.: PCT/JP2013/084627
§ 371 (c)(1),
(2) Date: Jul. 16, 2015

(87) PCT Pub. No.: WO2014/115473
PCT Pub. Date: Jul. 31, 2014

(65) Prior Publication Data
US 2015/0349407 A1    Dec. 3, 2015

(30) Foreign Application Priority Data

Jan. 22, 2013 (JP) .................................. 2013-009302

(51) Int. Cl.
*H01Q 1/38* (2006.01)
*H01Q 1/24* (2006.01)
(Continued)

(52) U.S. Cl.
CPC ............. *H01Q 1/243* (2013.01); *H01Q 5/371* (2015.01); *H01Q 9/42* (2013.01); *H01Q 13/10* (2013.01); *H05K 5/0247* (2013.01)

(58) Field of Classification Search
CPC ........ H01Q 1/243; H01Q 1/38; H01Q 1/2266; H01Q 5/328; H01Q 13/106; H01Q 1/2291; H01Q 1/42
(Continued)

(56) References Cited

U.S. PATENT DOCUMENTS 5,936,583 A    8/1999 Sekine et al.
7,830,323 B2   11/2010 Tsujimura et al.
(Continued)

FOREIGN PATENT DOCUMENTS

JP    4-291502 A   10/1992
JP    6-169217 A    6/1994
(Continued)

OTHER PUBLICATIONS

International Search Report mailed Feb. 18, 2014, corresponding to International application No. PCT/JP2013/084627.
(Continued)

*Primary Examiner* — Linh Nguyen
(74) *Attorney, Agent, or Firm* — Hauptman Ham, LLP

(57) ABSTRACT

Provided is an electronic device in which, if an antenna element is formed on the surface of a housing, restrictions on the formation of the antenna element are less likely to arise. The following are provided: a rear case, an antenna element, and a power supply unit that supplies power to the antenna element. The antenna unit comprises a first section that is formed by applying a conductive material onto a first main surface of the rear case, and a second section. A dielectric or an insulator is interposed between the first section and the second section.

9 Claims, 18 Drawing Sheets

(51) Int. Cl.
*H05K 5/02* (2006.01)
*H01Q 13/10* (2006.01)
*H01Q 5/371* (2015.01)
*H01Q 9/42* (2006.01)

(58) Field of Classification Search
USPC .......................................... 343/700 MS, 702
See application file for complete search history.

(56) References Cited

U.S. PATENT DOCUMENTS

| | | | |
|---|---|---|---|
| 8,624,788 B2* | 1/2014 | Ayatollahi | H01Q 1/243 343/745 |
| 8,743,014 B2* | 6/2014 | Kondo | H01Q 1/243 343/702 |
| 8,779,999 B2* | 7/2014 | Gummalla | G06F 1/1656 343/702 |
| 2008/0191954 A1 | 8/2008 | Tsujimura et al. | |
| 2009/0015490 A1* | 1/2009 | Honda | H01Q 1/243 343/702 |
| 2009/0066596 A1 | 3/2009 | Fujishima et al. | |
| 2009/0135077 A1* | 5/2009 | Kim | H01Q 7/00 343/843 |
| 2011/0254745 A1 | 10/2011 | Tsujimura et al. | |
| 2012/0092220 A1* | 4/2012 | Tani | H01Q 1/38 343/702 |
| 2012/0313827 A1* | 12/2012 | Kim | H01Q 1/243 343/702 |
| 2013/0044031 A1* | 2/2013 | Hsu | H01Q 5/378 343/700 MS |
| 2013/0154888 A1* | 6/2013 | Lin | H01Q 1/2266 343/745 |
| 2013/0249744 A1* | 9/2013 | Jang | H01Q 21/30 343/702 |
| 2013/0271330 A1* | 10/2013 | Bishop | H01Q 15/0086 343/745 |
| 2014/0320379 A1* | 10/2014 | Hamabe | H01Q 21/0075 343/893 |
| 2014/0340277 A1* | 11/2014 | Wong | H01Q 5/371 343/860 |
| 2015/0061940 A1* | 3/2015 | Chen | H01Q 9/0421 343/700 MS |
| 2015/0123871 A1* | 5/2015 | Chang | H01Q 1/243 343/872 |

FOREIGN PATENT DOCUMENTS

| | | |
|---|---|---|
| JP | 9-93029 A | 4/1997 |
| JP | 2008-186353 A | 8/2008 |
| JP | 2008-199309 A | 8/2008 |
| JP | 2008-306709 A | 12/2008 |
| JP | 2009-65388 A | 3/2009 |

OTHER PUBLICATIONS

Office Action in JP Application No. 2016-208576, dated Aug. 1, 2017, for which an explanation of relevance is attached.

* cited by examiner

100 mag(VSWR 1)[Magnitude]

Frequency (MHz)

200 mag(VSWR 1)[Magnitude]

Frequency

ELECTRONIC DEVICE

RELATED APPLICATIONS

The present application is a National Phase of International Application Number PCT/JP2013/084627, filed Dec. 25, 2013, which claims priority to Japanese Application Number 2013-009302, filed Jan. 22, 2013.

TECHNICAL FIELD

The present disclosure relates to an electronic device having an antenna element.

BACKGROUND ART

There is a type of antenna element that is configured by applying a conductive material on a surface of a base material.

A technique exists of applying a conductive material on a surface of a casing of an electronic device and using this as an antenna element.

SUMMARY

The electronic device of the present disclosure includes: a casing; an antenna element; and a power supply unit that supplies electrical power to the antenna element. The antenna element is composed of a first section which is formed by applying a conductive material on a first principal surface of the casing and a second section. A dielectric body or an insulating body is interposed between the first section and the second section.

In the electronic device, the casing is formed of the dielectric body or the insulating body. The first section is formed on the first principal surface of the casing. The second section is formed on a second principal surface which is on an opposite side to the first principal surface across the casing.

In the electronic device, a through hole which communicatively connects the first principal surface side with the second principal surface side is formed in the casing. A connecting unit which electrically connects a first end of the first section with a first end of the second section is disposed in the through hole. The power supply unit is in contact with a second end of the second section.

In the electronic device, a through hole which communicatively connects the first principal surface side with the second principal surface side is formed in the casing. A connecting unit which electrically connects a first end of the first section with a first end of the second section is disposed in the through hole. The power supply unit is in contact with the first end of the second section.

In the electronic device, the first principal surface is an outer surface of the casing. The second principal surface is an inner surface of the casing. The second section is disposed at a position which overlaps with the first section in a thickness direction of the casing. The length of the first section is smaller than the length of the second section.

In the electronic device, the first section is composed of a conductive adhesive that binds the casing with other members.

In the electronic device, the surface of the first section is covered by the dielectric body or the insulating body. The second section is formed by applying a conductive material on the dielectric body or the insulating body.

In the electronic device, a first end of the first section is connected with the power supply unit. The second section is a passive element. A first end of the second section is connected with the casing. A second end of the first section and a second end of the second section are facing each other across the dielectric body or the insulating body.

In the electronic device, the second section is formed by applying a conductive material on the dielectric body or the insulating body outside of a predetermined area. The predetermined area overlaps with the first section in a thickness direction of the dielectric body or the insulating body. An edge portion that forms a border with the predetermined area in the second section is supplied with electrical power by the power supply unit and operates as a slot antenna.

The electronic device further comprises a cover that is attached to the casing. The first section is formed on an outer surface of the casing. When the cover is attached to the casing, the inner surface of the cover is separated from the outer surface of the casing by a predetermined distance. The second section is formed by applying a conductive material on the inner surface of the cover.

In the electronic device, an opening for exposing an electronic component provided in the casing is formed on the cover. The second section is formed by applying a conductive material on an area surrounding the opening on the cover. The surrounding area overlaps with the first section in a thickness direction of the dielectric body or the insulating body. An edge portion that forms the area surrounding the opening in the second section is supplied with electrical power by the power supply unit and operates as a slot antenna.

PREFERRED MODE FOR CARRYING OUT THE DISCLOSURE

An embodiment for carrying out the present disclosure is described in detail with reference to the drawings. A smartphone is described hereafter as an example of the electronic device.

Since the antenna element is configured by the conductive material applied to the surface of the casing, there may be restrictions to the form of the antenna element according to frequency of transmitted and received signals.

Figure 1:
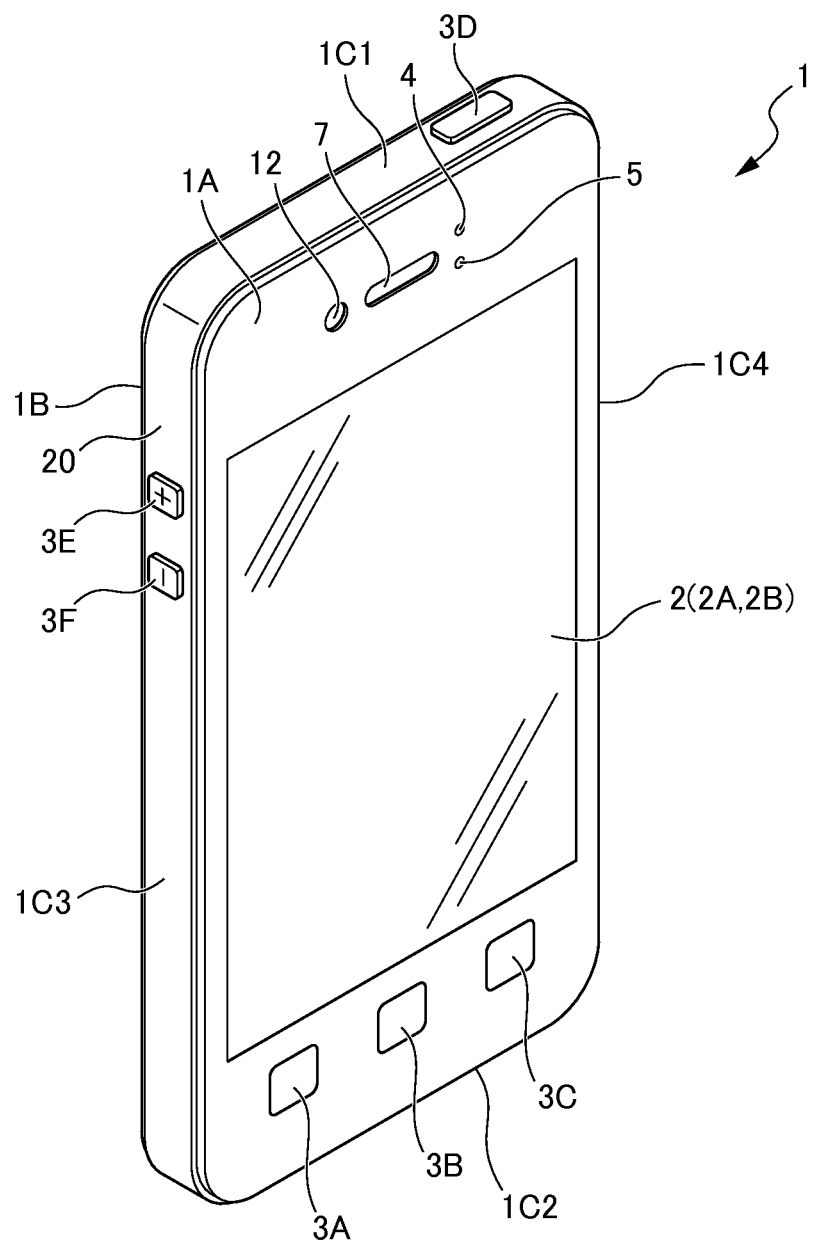
FIG. 1 is a perspective view illustrating the appearance of a smart phone.
Figure 2:
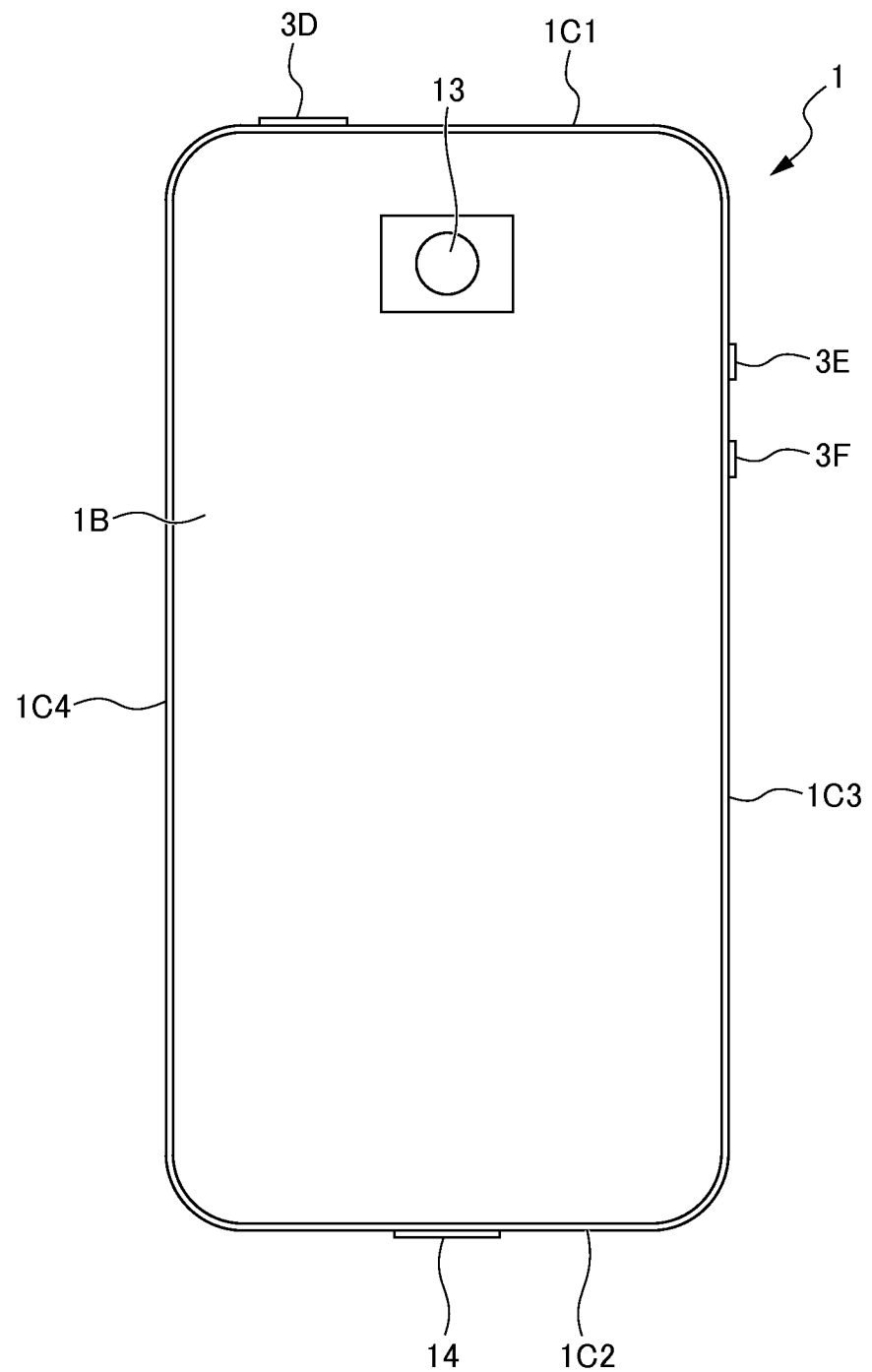
FIG. 2 is a back view illustrating the appearance of the smart phone.

The appearance of the smartphone 1 according to the embodiment is described with reference to FIGS. 1 and 2. As illustrated in FIGS. 1 and 2, the smartphone 1 has a front face 1A, a back face 1B, and side faces 1C1 to 1C4. The side faces 1C1 to 1C4 are sides connecting between the front face 1A and the back face 1B. Hereinafter, the side faces 1C1 to 1C4 may collectively be referred to as a side face 1C without specifying which face it is.

The smartphone 1 has, on the front face 1A, a touch screen display 2, buttons 3A to 3C, an illuminance sensor 4, a proximity sensor 5, a receiver 7, and a camera 12. The smartphone 1 has a camera 13 on the back face 1B. The smartphone 1 has buttons 3D to 3F and an external interface 14 on the side face 1C. Hereinafter, the buttons 3A to 3F may collectively be referred to as a button 3, without specifying which button it is.

The touch screen display 2 has a display 2A and a touch screen 2B. The display 2A is composed of a display device such as a liquid crystal display, an organic electro-luminescence panel, or an inorganic electro-luminescence panel. The display 2A displays characters, images, symbols, or figures.

The touch screen 2B detects touch on the touch screen display 2 by a finger, a stylus pen, or the like. The touch screen 2B can detect positions at which a plurality of fingers, stylus pens, or the like touch the touch screen display 2.

Detection method of the touch screen 2B can be any method such as: a capacitive method; a resistance film method; a surface acoustic wave method (or a supersonic method); an infrared method; an electromagnetic induction method; a load detection method; and the like. For simplicity of description, the finger, the stylus pen, or the like, where touch on the touch screen display 2 is detected by the touch screen 2B may be simply referred to as a "finger" hereinafter.

The smartphone 1 identifies type of gesture based on the touch, positions of the touch, duration of the touch, or a count of the touches detected by the touch screen 2B. The gesture is an operation performed with respect to the touch screen display 2. Gestures identified by the smartphone 1 include touch, long touch, release, swipe, tap, double tap, long tap, drag, flick, pinch in, pinch out, and the like.

The smartphone 1 operates according to these gestures identified through the touch screen 2B. Instinctive and easy-to-use operability for a user can thus be realized. Operations performed by the smartphone 1 according to the gestures identified are different depending on windows displayed on the touch screen display 2.

The button 3 is operated by the user. The button 3 includes buttons 3A to 3F. A controller 10 cooperates with the button 3 and detects operations on the button. The operations on the button are, for example, click, double click, push, and multi push.

For example, the buttons 3A to 3C are a Home button, a Back button, or a menu button. For example, the button 3D is a power ON/OFF button for the smartphone 1. The button 3D can function also as a sleep/wake button. For example, the buttons 3E and 3F are volume buttons.

The illuminance sensor 4 detects illuminance. The illuminance is, for example, light intensity, brilliance, brightness, and the like. The illuminance sensor 4 is used for, for example, adjustment of brightness of the display 2A.

The proximity sensor 5 detects presence of a proximate object in a contactless manner. The proximity sensor 5 detects, for example, approach of the touch screen display 2 toward a user's face.

The receiver 7 outputs a sound signal transmitted from the controller 10 as a sound. A microphone 8 converts a user's voice or the like into a sound signal and transmits to the controller 10. It should be noted that the smartphone 1 can have a speaker in addition to the receiver 7. The smartphone 1 can have a speaker in place of the receiver 7.

The camera 12 is an in-camera that takes a picture of an object facing the front face 1A. The camera 13 is an out-camera that takes a picture of an object facing the back face 1B. The external interface (connection unit) 14 is a terminal to which another device is connected.

Figure 3:
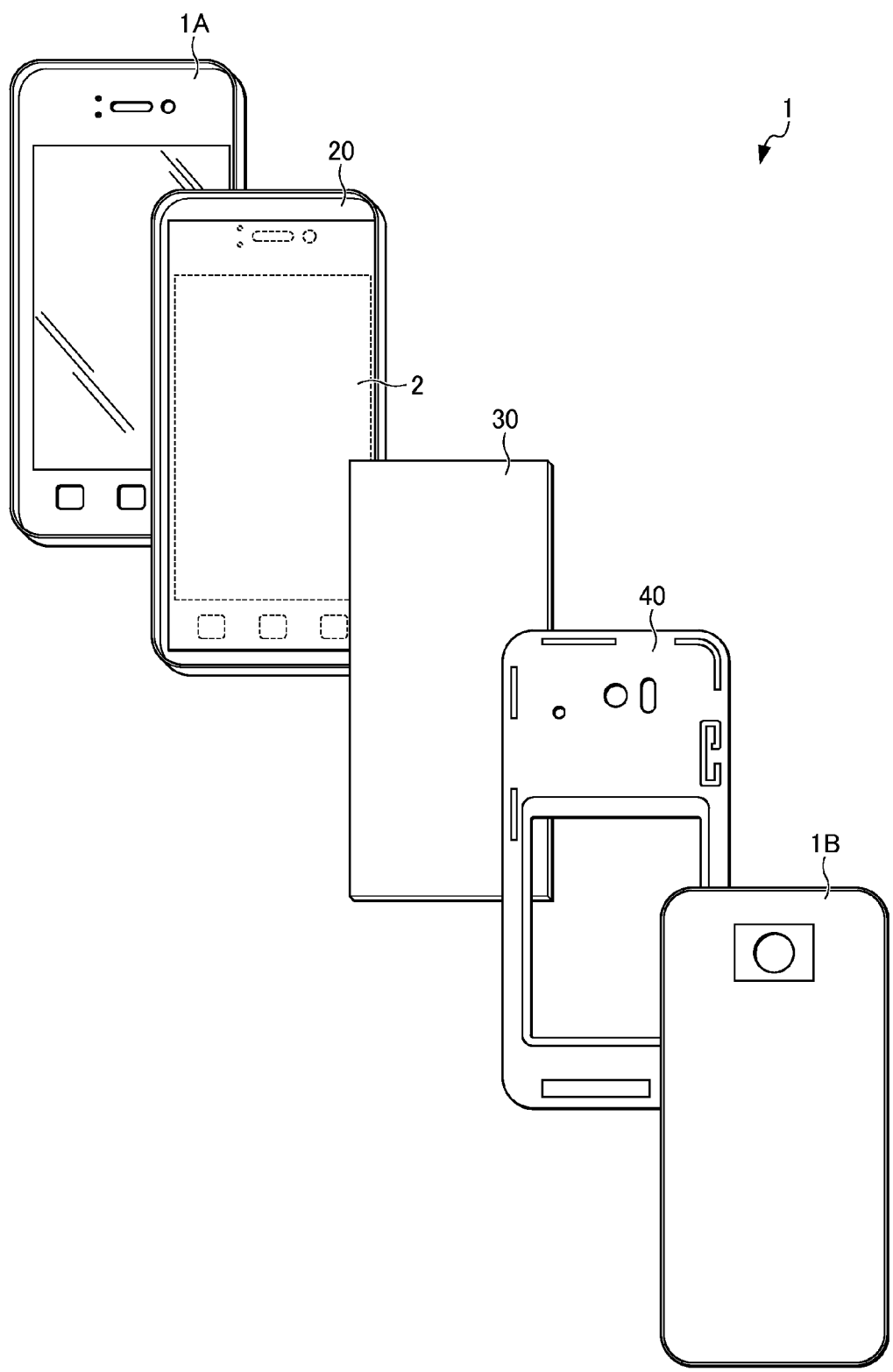
FIG. 3 is an exploded perspective view of the smart phone.

In addition, FIG. 3 illustrates a perspective view of the exploded smartphone 1. The smartphone 1 is composed of the front face 1A, a front case 20, the touch screen display 2, a circuit substrate 30, a rear case 40, and the back face 1B. It should be noted that FIG. 3 illustrates a state in which the touch screen display 2 is housed in the front case 20.

The smartphone 1 according to the present embodiment proposes a configuration in which an antenna element is formed on the surface of the rear case 40 without being restricted by the surface form thereof. A specific configuration is described hereinafter.

First Embodiment

Figure 4:
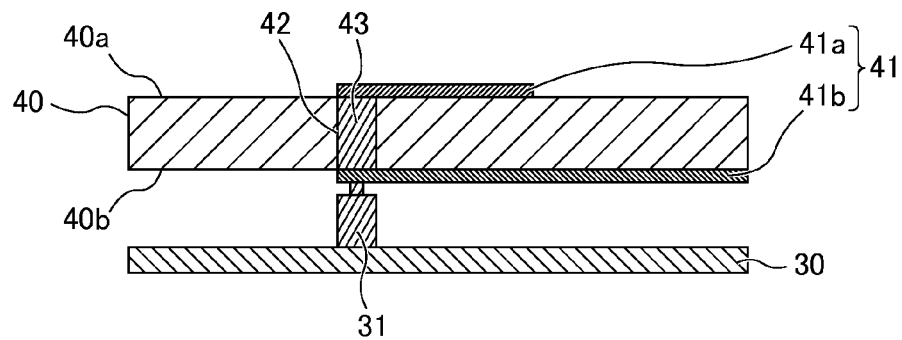
FIG. 4 is a cross-sectional view illustrating a first configuration where an antenna element is formed on a rear case.

As illustrated in FIG. 4, the smartphone 1 is provided with the rear case 40, the antenna element 41, and the power supply unit 31.

The antenna element 41 is composed of a first section 41a which is formed by applying a conductive material on the surface of the rear case 40 and a second section 41b.

In addition, a dielectric body or an insulating body is interposed between the first section 41a and the second section 41b. The dielectric body may conceptually include air.

The power supply unit 31 supplies electrical power to the antenna element 41. The power supply unit 31 is disposed on the circuit substrate 30. The power supply unit 31 is composed of a pogo pin type spring pin connector. In such a configuration, in the smartphone 1, the second section 41b of the antenna element 41 can be pressed against an extremity of the power supply unit 31 with a constant pressure.

Accordingly, in the smartphone 1, since the antenna element 41 is formed on the surface of the rear case 40 separated from the first section 41a and the second section 41b, the antenna element 41 can be formed on the surface without being restricted by the surface form of the rear case 40.

The rear case 40 is formed of a dielectric body such as resin or an insulating body such as glass.

As illustrated in FIG. 4, the first section 41a is formed on a first principal surface 40a of the rear case 40.

As illustrated in FIG. 4, the second section 41b is formed on a second principal surface 40b which is on an opposite side to the first principal surface 40a across the rear case 40.

A through hole 42 which communicatively connects the first principal surface 40a side with the second principal surface 40b side is formed on the rear case 40.

A connecting unit 43 which electrically connects a first end of the first section 41a with a first end of the second section 41b is disposed in the through hole 42. The connecting unit 43 is formed of the dielectric body having the same shape (for example, a cylindrical shape) as the through hole 42. The power supply unit 31 is in contact with the first end of the second section 41b.

Accordingly, in the smartphone 1, since the first section 41a and the second section 41b area are formed across the rear case 40, the antenna element 41 can be formed on the surface without being restricted by the surface form of the rear case 40.

In addition, the smartphone 1 can compose a double resonance antenna with the first section 41a and the second section 41b.

Figure 5:
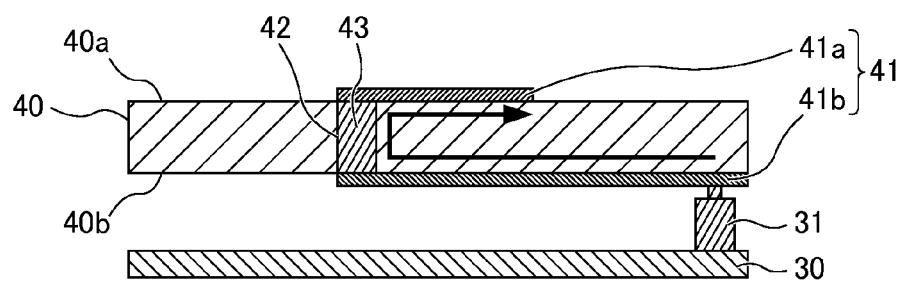
FIG. 5 is a cross-sectional view illustrating a second configuration where the antenna element is formed on the rear case.

As illustrated in FIG. 5, the through hole 42 which communicatively connects the first principal surface 40a side with the second principal surface 40b side is formed on the rear case 40.

A connecting unit 43 which electrically connects a first end of the first section 41a with a first end of the second section 41b is disposed in the through hole 42. The power supply unit 31 is in contact with the second end of the second section 41b.

Accordingly, in the smartphone 1, since the first section 41a and the second section 41b are formed to interpose the rear case 40, the antenna element 41 can be formed on the surface without being restricted by the surface shape of the rear case 40.

In addition, the smartphone 1 can use the first section 41a, the connecting unit 43, and the second section 41b as a single elongated antenna element 41 to thereby receive long wavelength signals such as terrestrial digital broadcasting and the like.

The first section 41a is formed on the outer surface of the rear case 40.

The second section 41b is disposed on the inner surface of the rear case 40 at a position which overlaps with the first section 41a in a thickness direction of the rear case 40.

The first section 41a is formed to have a shorter length than the second section 41b (refer to FIG. 4).

In such a configuration, the smartphone 1 can effectively utilize space by superposing the double resonance antenna. In addition, the second section 41b is not fully covered by the first section 41a in a direction of overlap of the antenna element 41, and the smartphone 1 can therefore secure the antenna characteristics of the second section 41b.

The first section 41a can also be composed of a conductive adhesive that binds the rear case with other members.

Figure 6:
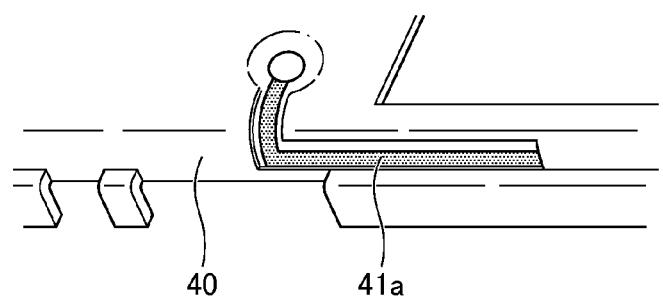
FIG. 6 is a descriptive diagram in which a first section, which is composed of a conductive adhesive, is formed on the rear case.

More specifically, the first section 41a is formed in a groove formed on the surface of the rear case 40 as illustrated in FIG. 6.

In such a configuration, the smartphone 1 can use the first section 41a as an antenna, and also as the adhesive to bind the rear case 40 with the back face 1B. The smartphone 1 can thus use space more effectively.

Here, a specific configuration for bringing the power supply unit 31 into contact with the second section 41b is described. It should be noted that the first section 41a is assumed to be formed of a paste material using silver granule, which is a conductive adhesive. The power supply unit 31 is assumed to be composed of a pogo pin type spring pin connector (refer to FIG. 4).

Figure 7:
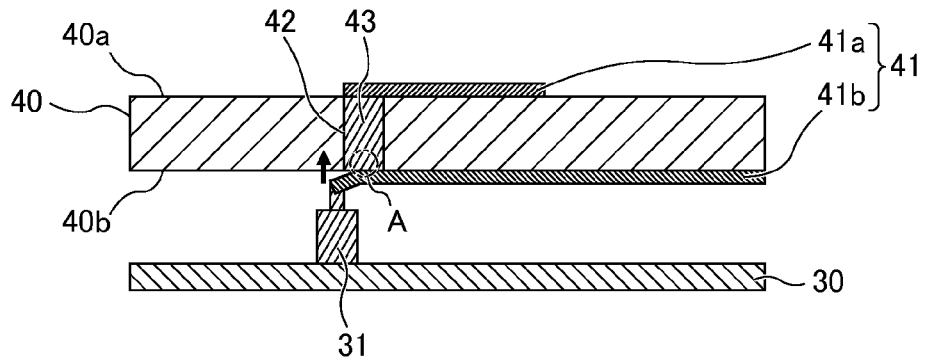
FIG. 7 is a first diagram providing a description in which a second section is formed of sheet metal.
Figure 8:
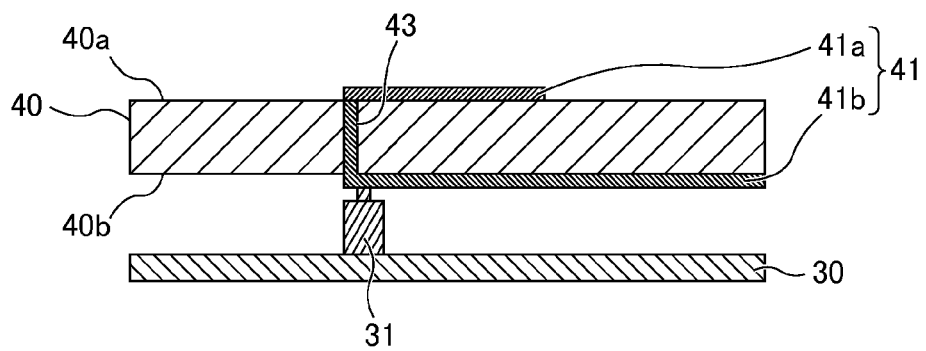
FIG. 8 is a second diagram providing a description in which a second section is formed of sheet metal.
Figure 9:
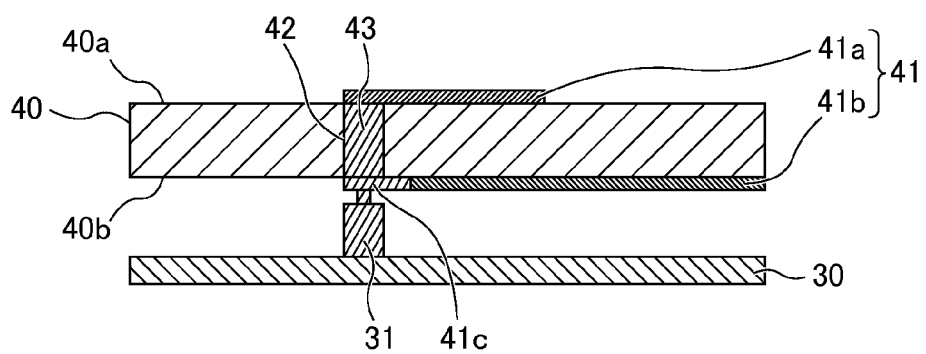
FIG. 9 is a first diagram providing a description in which the second section is formed of a flexible printed substrate.

First, a case in which the second section 41b is formed of sheet metal is described hereafter with reference to FIGS. 7 and 8.

Since the sheet metal is rigid, stable contact with the power supply unit 31 in a planar state may be difficult. Given this, the second section 41b employs a configuration in which an end (A in FIG. 7), which is in contact with the power supply unit 31, is bent as illustrated in FIG. 7.

Employing such a configuration provides a stronger contact between the power supply unit 31 and the second section 41b, and can secure a preferable contact state.

The smartphone 1 can also be configured such that an extremity of the second section 41b is bent and inserted into the through hole 42, to thereby bring the second section 41b into direct contact with the first section 41a (refer to FIG. 8). In such a configuration, the smartphone 1 does not need the connecting unit 43 and can reduce the number of components and cost.

A case in which the second section 41b is formed of a flexible printed substrate is described hereafter with reference to FIGS. 9, 10, 11A, and 11B.

The flexible printed substrate is more flexible than the sheet metal. The second section 41b can therefore be in preferable contact with the power supply unit 31 without bending the extremity of the second section 41b.

Figure 10:
FIG. 10 is a second diagram providing a description in which the second section is formed of the flexible printed substrate.

The power supply unit 31 and the connecting unit 43 are electrically conducted with each other via the end 41c of the second section 41b. Therefore, the end 41c can be configured such that the flexible printed substrate is composed of two layers: upper and lower layers, which are connected through a via hole (FIG. 10).

Figure 11A:
FIG. 11A is a third diagram, which is a cross-sectional view, providing a description in which the second section is formed of the flexible printed substrate.
Figure 11B:
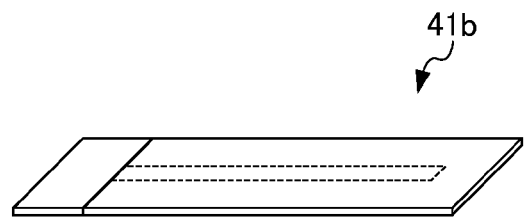
FIG. 11B is a third diagram, which is a perspective view, providing a description in which the second section is formed of the flexible printed substrate.

As illustrated in FIG. 11A, the end 41c can be configured with a single layer of the flexible printed substrate. In this case, cover lays on the upper face and the lower face of the flexible printed substrate are peeled off. As illustrated in FIG. 11B, the second section 41b forms an antenna pattern on the flexible printed substrate.

Accordingly, the smartphone 1 can bring the second section 41b into preferable contact with the power supply unit 31.

Figure 12A:
FIG. 12A is a diagram, which is a first cross-sectional view, providing a description in which the second section is formed of a rigid substrate.
Figure 12B:
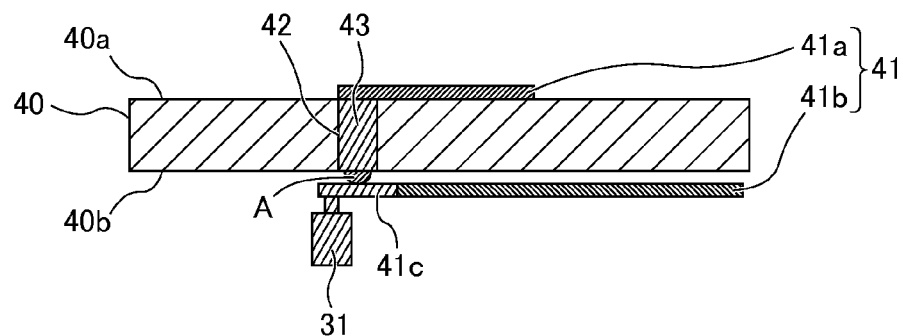
FIG. 12B is a diagram, which is a second cross-sectional view, providing a description in which the second section is formed of the rigid substrate.

A case in which the second section 41b is formed of a rigid substrate is described hereafter with reference to FIGS. 12A and 12B.

If an interface between the second section 41b and the connecting unit 43 is planar, the contact state may not be stable. Given this, a convex portion A is formed by applying solder to the end 41c of the second section 41b that is in contact with the connecting unit 43, as illustrated in FIG. 12A. In such a configuration, the smartphone 1 can bring the second section 41b into contact with the power supply unit 31 and with the connecting unit 43, in a preferred manner The convex portion A is not limited to the above described one and can also be formed on the connecting unit 43 that is in contact with the second section 41b (refer to FIG. 12B). In such a case, as illustrated in FIG. 12B, the power supply unit 31 is arranged at a position which does not correspond to a position at which the convex portion A formed on the connecting unit 43 is in contact, in a vertical direction across the end 41c of the second section 41b.

Figure 13:
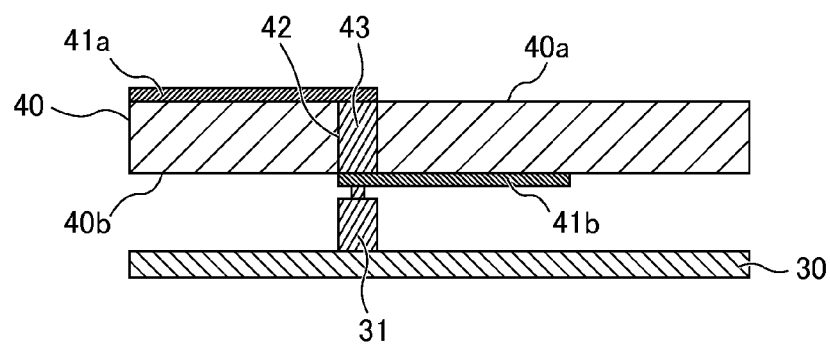
FIG. 13 is a cross-sectional view illustrating a third configuration in which the antenna element is formed on the rear case.

As illustrated in FIG. 13, the smartphone 1 can be configured from a dipole antenna by forming the first section 41a and the second section 41b of the antenna element 41 in different directions from the connecting unit 43. In a case of configuring the dipole antenna, the length of the first section 41a and the length of the second section 41b can be the same.

Second Embodiment

In the first embodiment, by forming the first section 41a and the second section 41b across the rear case 40, the shape of the antenna element 41 does not depend on the surface shape of the rear case 40.

If the second section 41b is formed on the first section 41a without interposing the rear case 40, a two-dimensional planar antenna results, and sufficient antenna characteristics may not be obtained.

In order to secure the antenna characteristics, a configuration coupling a passive element to the antenna for widening the bandwidth and a configuration disposing a plurality of elements for multiple resonance may be considered; however, coupling is difficult with such a two-dimensional planar antenna.

Here, a case in which a first antenna element 100 is coupled to a second antenna element 200 to thereby configure a double resonance antenna is considered.

Figure 14A:
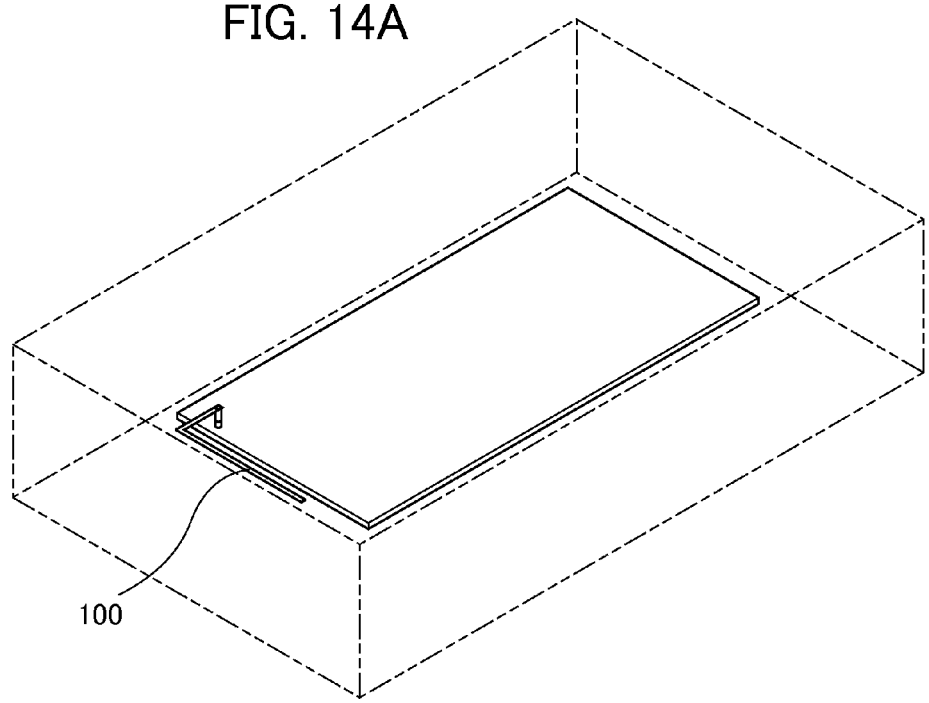
FIG. 14A is a first diagram, which is a perspective view, providing a description in which a first antenna element is bound to a second antenna element to thereby configure a double resonance antenna.
Figure 14B:
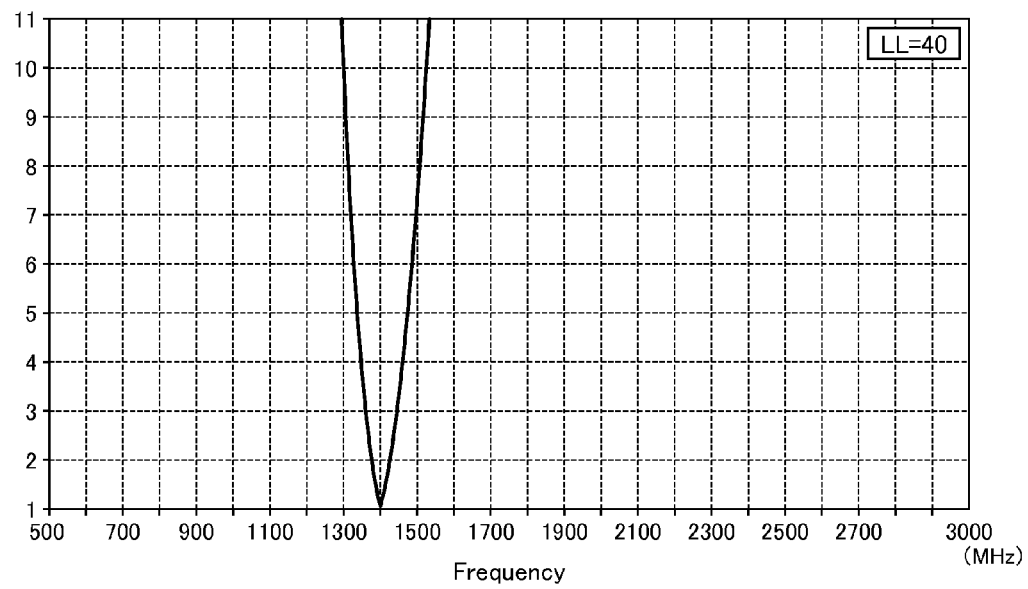
FIG. 14B is a first diagram, which is a diagram of frequency characteristics, providing a description in which the first antenna element is bound to the second antenna element to thereby configure the double resonance antenna.

The first antenna element 100 is formed on the rear case 40 (not illustrated) as illustrated in FIG. 14A. The first antenna element 100 is assumed to have frequency characteristics of resonating in the vicinity of 1400 MHz as illustrated in FIG. 14B.

Figure 15A:
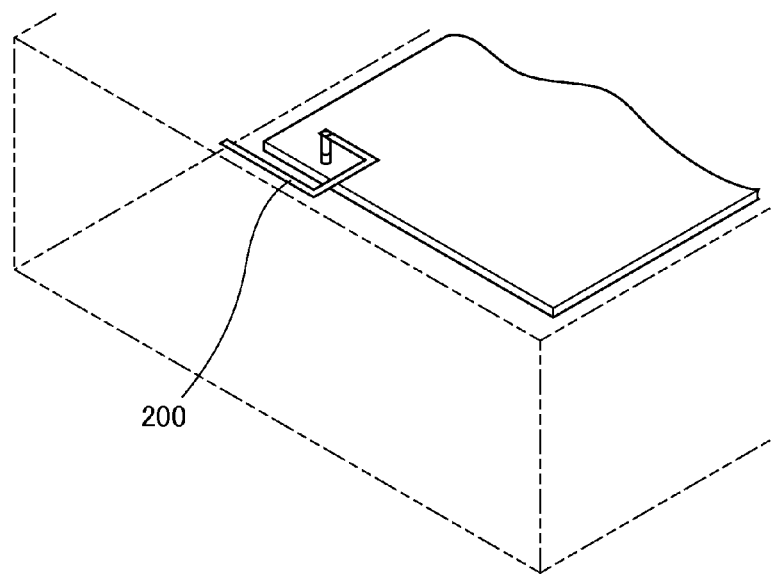
FIG. 15A is a second diagram, which is a perspective view, providing a description in which a first antenna element is bound to a second antenna element to thereby configure a double resonance antenna.
Figure 15B:
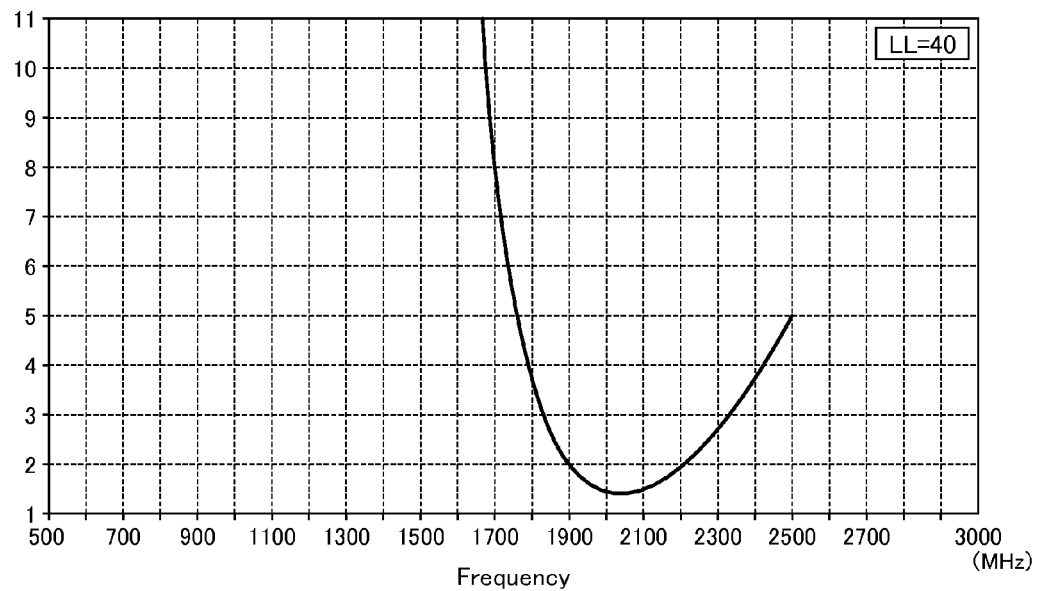
FIG. 15B is a second diagram, which is a diagram of frequency characteristics, providing a description in which the first antenna element is bound to the second antenna element to thereby configure the double resonance antenna.

The second antenna element 200 is formed on the rear case 40 (not illustrated) as illustrated in FIG. 15A. The second antenna element 200 is assumed to have frequency characteristics of resonating in the vicinity of 2000 MHz as illustrated in FIG. 15B.

Figure 16:
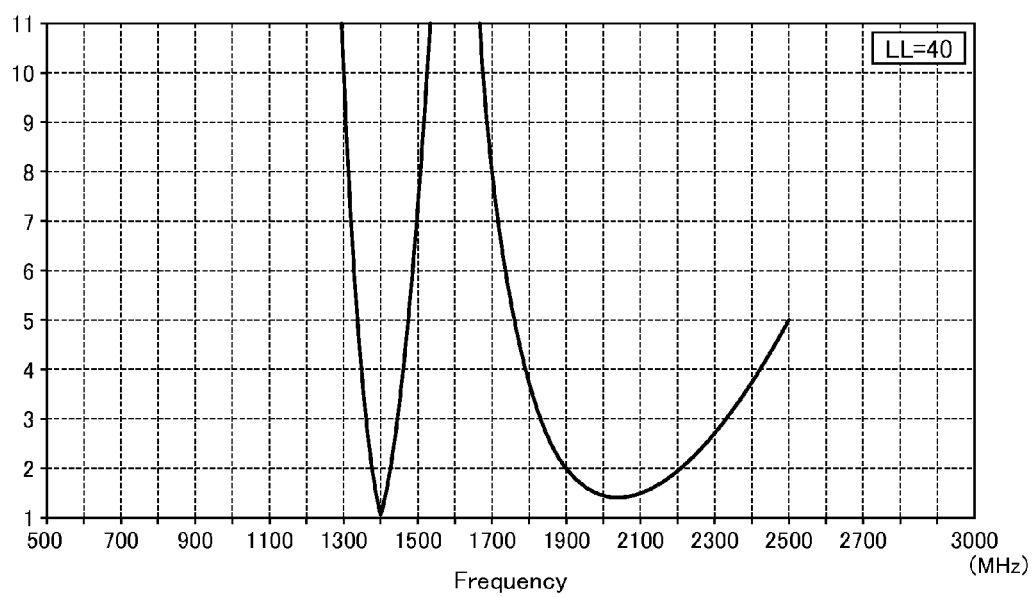
FIG. 16 is a third diagram providing a description in which a first antenna element is bound to a second antenna element to thereby configure a double resonance antenna.

If the first antenna element 100 is coupled with the second antenna element 200, in theory, frequency characteristics of resonating in the vicinity of 1400 MHz and 2000 MHz are obtained as illustrated in FIG. 16.

Figure 17A:
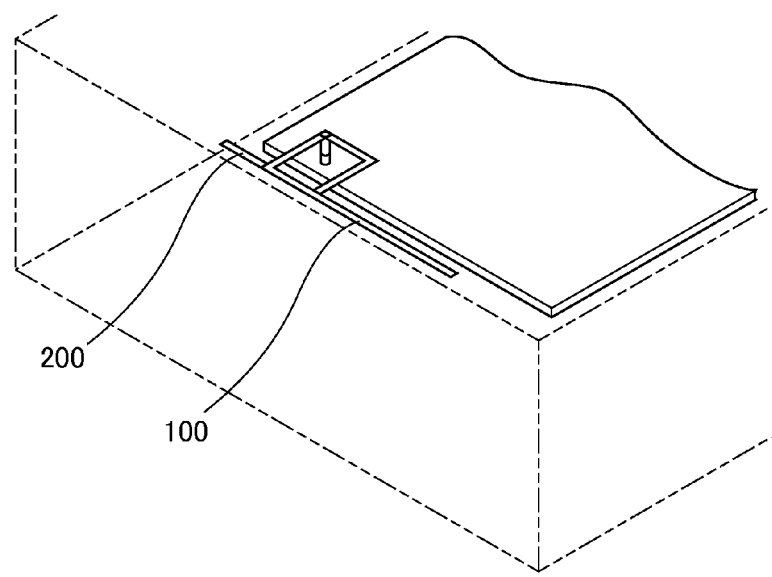
FIG. 17A is a fourth diagram, which is a perspective view, providing a description in which a first antenna element is bound to a second antenna element to thereby configure a double resonance antenna.
Figure 17B:
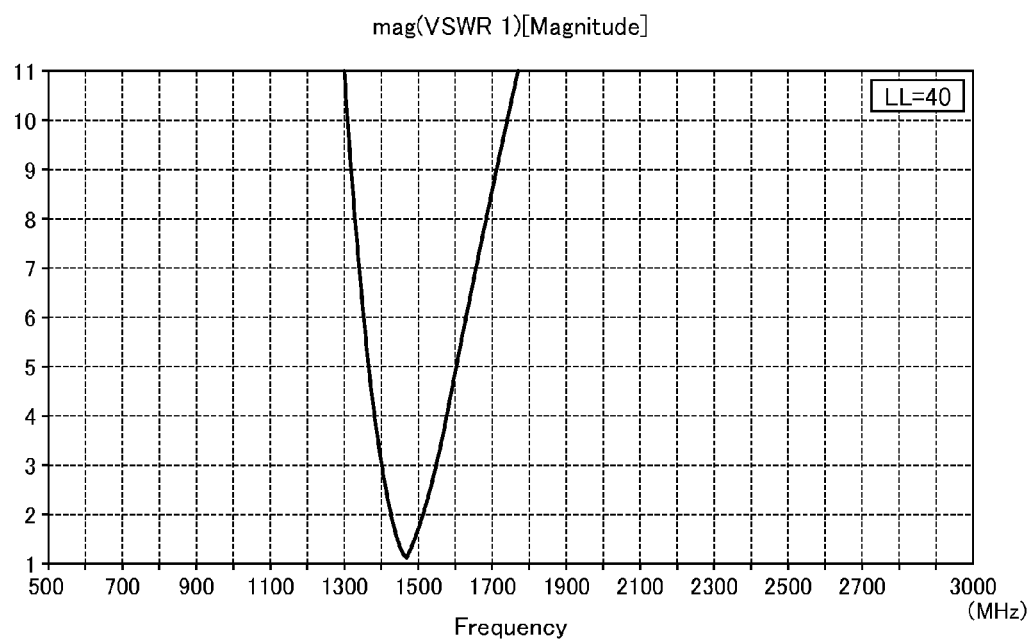
FIG. 17B is a fourth diagram, which is a diagram of frequency characteristics, providing a description in which the first antenna element is bound to the second antenna element to thereby configure the double resonance antenna.

However, if the second antenna element 200 is simply formed by printing on the first antenna element 100, the antenna elements are close to (or adhere to) each other in a vertical direction, as shown in FIG. 17A. In such a case, these are not recognized as separate antennas, resulting in frequency characteristics of resonating only in the vicinity of 1500 MHz, as shown in FIG. 17B.

Given this, the smartphone according to the present embodiment employs the following configuration in order to obtain frequency characteristics of double resonance.

The first section 41a is formed on the surface of the rear case 40. On the surface of the first section 41a, a dielectric body or an insulating body (hereinafter referred to as dielectric body) 50 is formed. On the surface of the dielectric body 50, the second section 41b is formed by applying the conductive material (refer to FIG. 18). On the surface of the second section 41b and the dielectric body 50, a cover layer 51 is formed. The cover layer 51 is formed of, for example, a resin. By forming the cover layer 51, the second section 41b and the dielectric body 50 can be prevented from being damaged by an external force.

Figure 18:
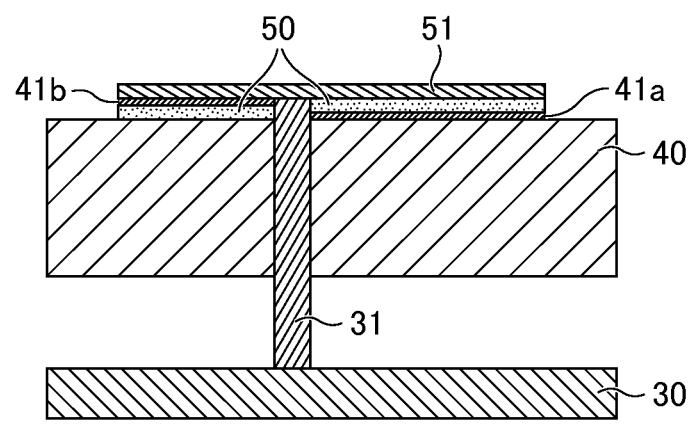
FIG. 18 is a cross-sectional view illustrating a fourth configuration in which the antenna element is formed on the rear case.

It should be noted that, in FIG. 18, the power supply unit 31 is illustrated being exposed to the surface of the rear case 40 through the through hole 42 formed on the rear case 40, from the circuit substrate 30, and connecting to the first section 41a and the second section 41b; however, the present disclosure is not limited thereto. As in the first embodiment, the power supply unit 31 can connect to the first section 41a and the second section 41b through the connecting unit 43 inserted into the through hole 42.

Figure 19A:
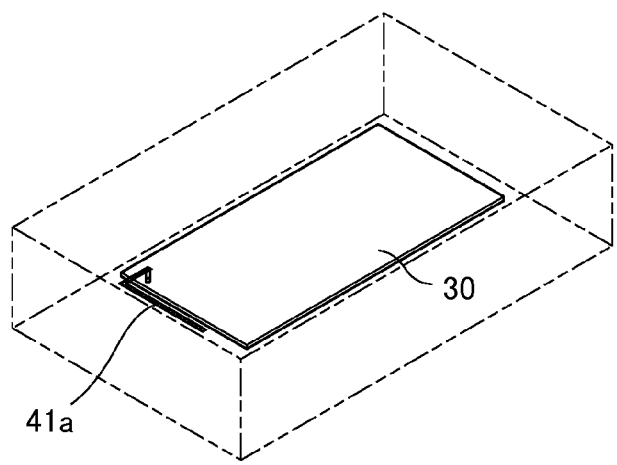
FIG. 19A is a first perspective view providing a description in which a first section is bound to a second section to thereby configure a double resonance antenna.
Figure 19B:
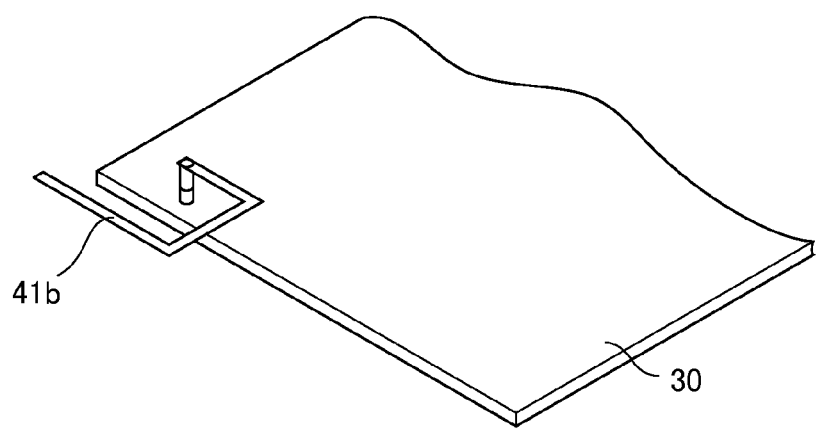
FIG. 19B is a second perspective view providing a description in which the first section is bound to the second section to thereby configure the double resonance antenna.
Figure 19C:
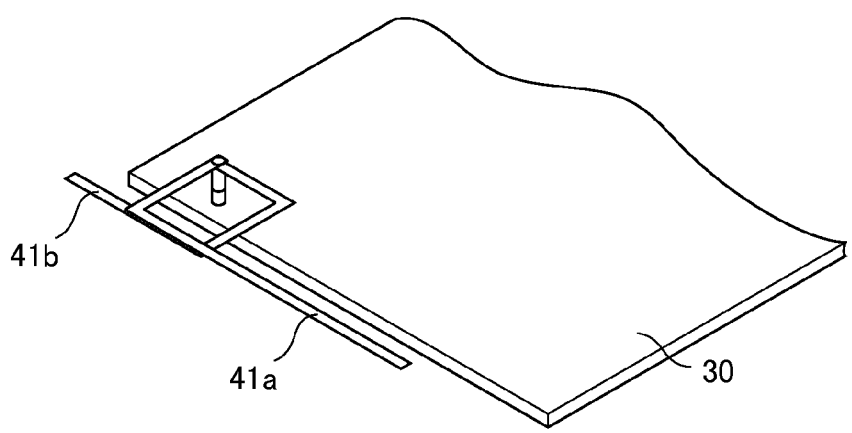
FIG. 19C is a third perspective view providing a description in which the first section is bound to the second section to thereby configure the double resonance antenna.

More specifically, the first section 41a of a predetermined pattern (refer to FIG. 19A) is formed on the rear case 40. The dielectric body 50 is formed by applying an insulating paint on the surface of the first section 41a outside of the power supply unit 31, to a predetermined thickness d. The second section 41*b* of a predetermined pattern (refer to FIG. 19B) is then formed on the surface of the dielectric body 50. The first section 41*a* and the second section 41*b* are thus formed (refer to FIG. 19C).

Figure 20A:
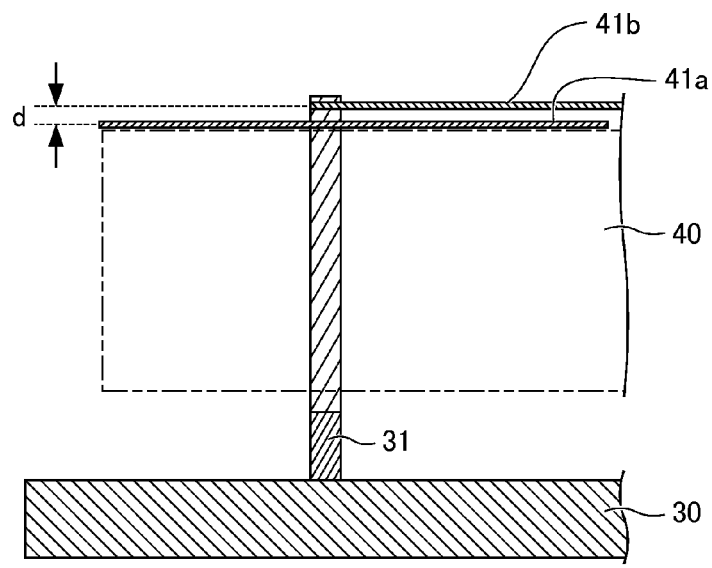
FIG. 20A is a cross-sectional view in which the thickness of a dielectric body or an insulating body is changed.
Figure 20B:
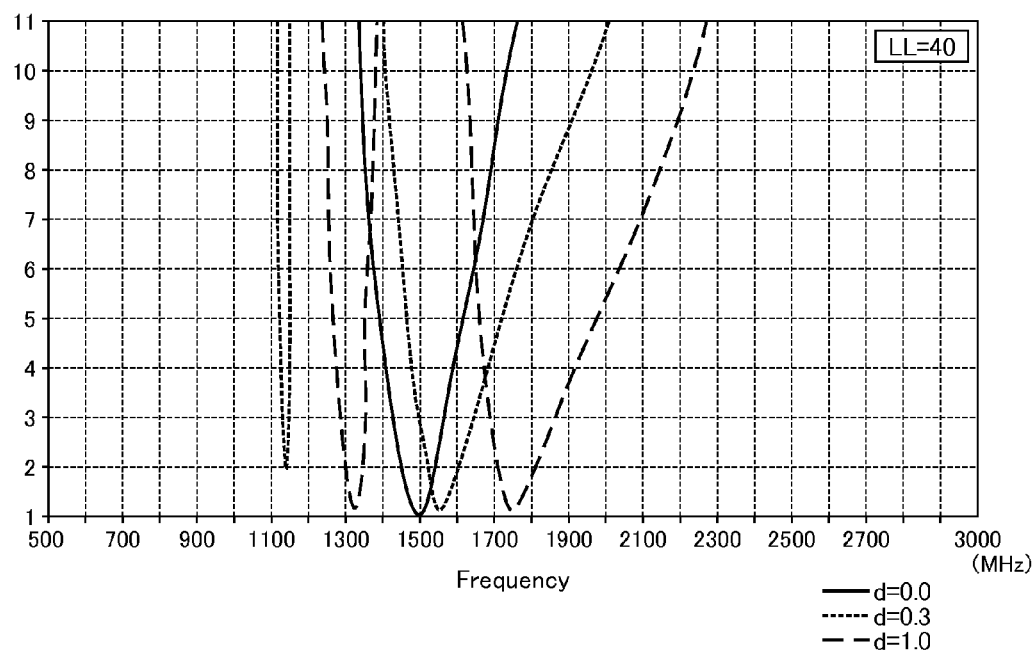
FIG. 20B is a diagram showing frequency characteristics when the thickness of the dielectric body or the insulating body is changed.

Here, frequency characteristics are shown in FIG. 20B for a case in which the thickness d (FIG. 20A) of the dielectric body 50 is changed.

With the thickness d of the dielectric body 50 being 0, characteristics of resonating only in the vicinity of 1500 MHz were obtained. With the thickness d of the dielectric body 50 being 0.3, characteristics of resonating in the vicinity of 1100 MHz and 1600 MHz were obtained. With the thickness d of the dielectric body 50 being 1.0, characteristics of resonating in the vicinity of 1300 MHz and 1800 MHz were obtained.

Accordingly, the smartphone 1 can resonate at a plurality of positions by increasing the thickness d of the dielectric body 50, in other words by increasing the distance between the first section 41*a* and the second section 41*b*.

The smartphone 1 can shift resonance point toward the higher frequency by increasing the thickness d of the dielectric body 50, in other words by increasing the distance between the first section 41*a* and the second section 41*b*.

By coupling the first section 41*a* with the second section 41*b*, the smartphone 1 can resonate in a frequency band lower than the resonant frequencies obtained with each of these portions, and can reduce the length of the element.

In the present embodiment, layering of two elements, the first section 41*a* and the second section 41*b*, has been described; however, antenna characteristics of triple resonance and the like can also be realized by layering three or more elements. Accordingly, by forming the antenna element 41 by layering a plurality of elements, the smartphone 1 can form and couple elements of various shapes in various sites on the rear case 40, to thereby greatly improve degree of freedom in design of an antenna.

For a purpose of widening the bandwidth of an antenna and the like, there is a method of disposing a passive element in the vicinity of the antenna and coupling thereto. However, in a conventional smartphone, due to the limited internal space, the antenna can only be coupled to the passive element in a two dimensional way on an X-Y plane and sufficient coupling may not be obtained.

Given this, in the present embodiment, a configuration is proposed in which the antenna element 41 and the passive element face each other with a predetermined clearance in a Z axis direction, and the antenna element 41 is preferably coupled with the passive element without increasing the internal space of the smartphone 1.

Figure 21A:
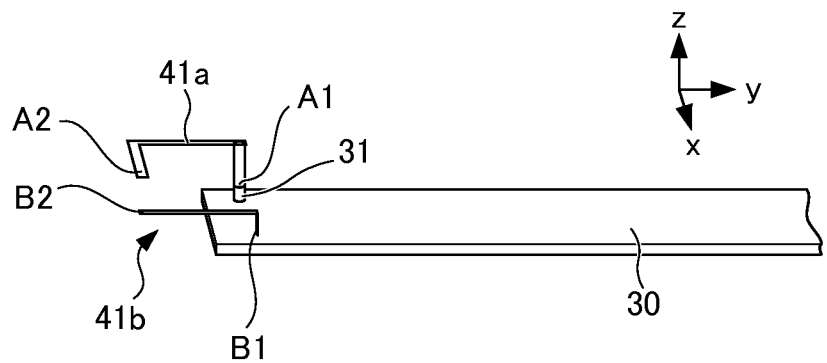
FIG. 21A is a perspective view schematically illustrating the first section and the second section facing each other about a Z axis.
Figure 21B:
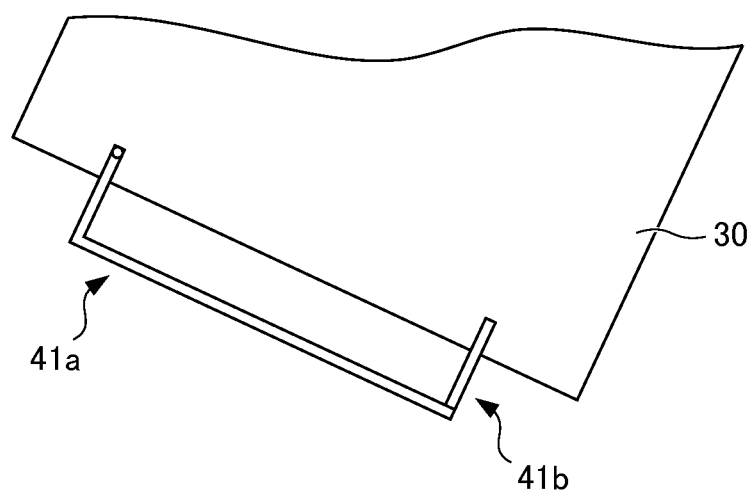
FIG. 21B is a cross-sectional view schematically illustrating the first section and the second section facing each other about a Z axis.
Figure 21C:
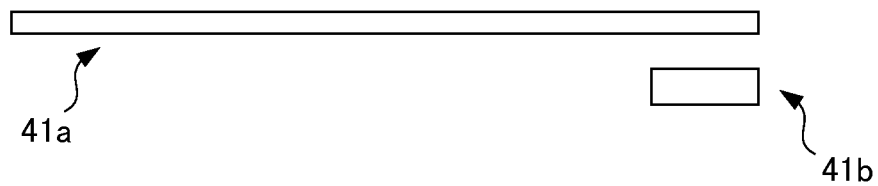
FIG. 21C is a side view schematically illustrating the first section and the second section facing each other about a Z axis.

More specifically, as illustrated in FIGS. 21A, 21B and 21C, the first end A1 of the first section 41*a* is connected to the power supply unit 31. The second section 41*b* functions as the passive element. A first end B1 of the second section 41*b* is connected with the circuit substrate 30. A second end A2 of the first section 41*a* and a second end B2 of the second section 41*b* face each other across the dielectric body or the insulating body. The first end B1 of the second section 41*b* can also be connected with the rear case 40 instead of the circuit substrate 30.

FIG. 21A is a perspective view schematically illustrating the first section 41*a* and the second section 41*b* facing to each other about a Z axis. FIG. 21B is a schematic view taken from the Z axis direction. FIG. 21C is a schematic view taken from the Y axis direction. It should be noted that the rear case 2 and the like are omitted in FIGS. 21A, 21B and 21C.

In such a configuration, in the smartphone 1, the first section 41*a* acting as an antenna and the second section 41*b* acting as a passive element can be coupled in the Z axis direction.

Figure 22A:
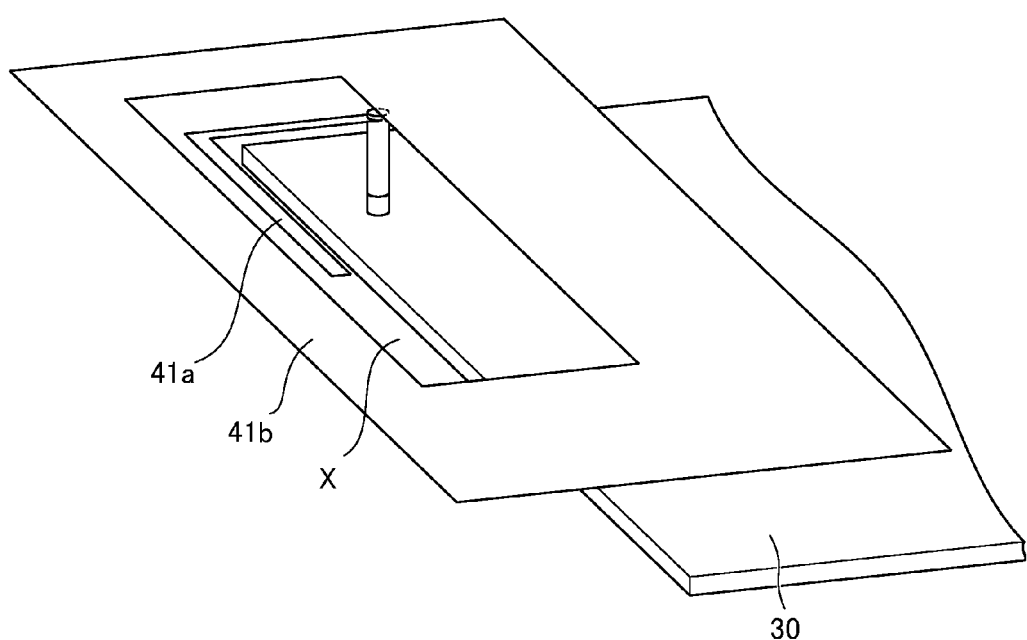
FIG. 22A is a perspective view in which the two portions are composed of slot antennas.
Figure 22B:
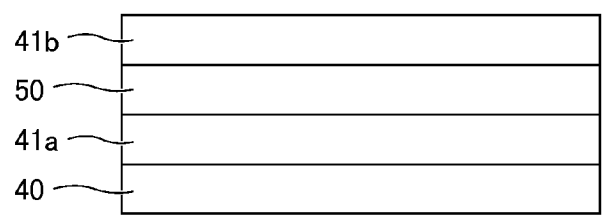
FIG. 22B is a cross-sectional view in which the two portions are composed of slot antennas.

The second section 41*b* can also be composed of a slot antenna. A specific configuration is described with reference to FIGS. 22A and 21B. It should be noted that FIG. 22A is a perspective view taken from the second section 41*b* side (the rear case 40 is not illustrated). FIG. 22B is a cross-sectional view illustrating a state in which the first section 41*a* is layered on the rear case 40.

The first section 41*a* is formed on the surface of the rear case 40. On the surface of the first section 41*a*, a dielectric body or an insulating body (hereinafter referred to as dielectric body and the like) 50 is formed.

The second section 41*b* is formed by applying a conductive material on the dielectric body 50 outside of a predetermined area (an opening X shown in FIG. 22A). The predetermined area overlaps with the first section 41*a* in a thickness direction of the dielectric body 50. An edge portion that forms a border with the predetermined area in the second section 41*b* is supplied with electrical power by the power supply unit 31 and operates as a slot antenna.

In addition, the predetermined area (the opening X) can be formed in a sufficient size to allow the first section 41*a* to function as an antenna. The resonant frequency of the slot antenna realized with the second section 41*b* is preferably adjusted to be lower than the resonant frequency of the antenna realized with the first section 41*a*. By such an adjustment, the smartphone 1 can obtain preferable antenna characteristics.

Figure 23A:
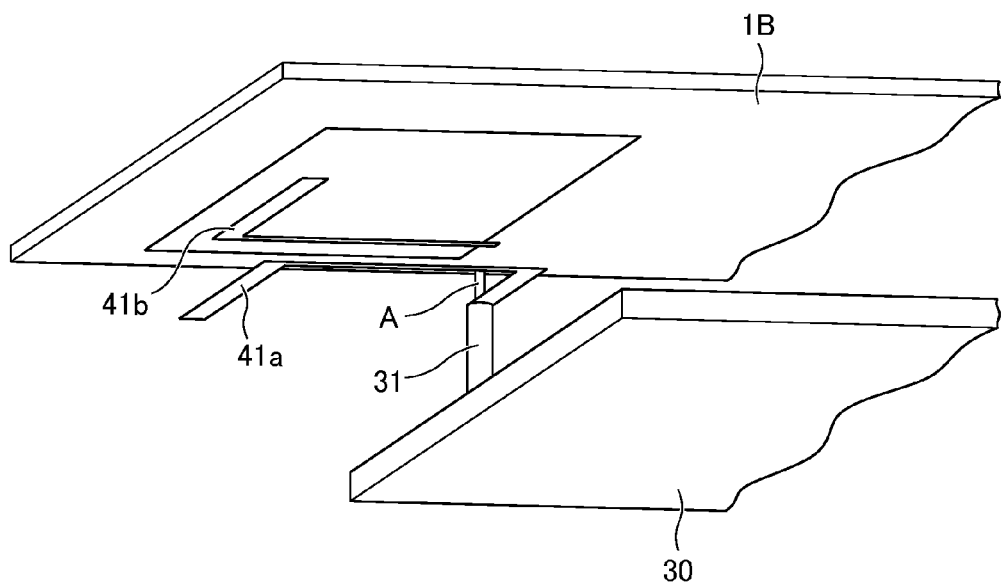
FIG. 23A is a perspective view in which the second section is formed on a back face.
Figure 23B:
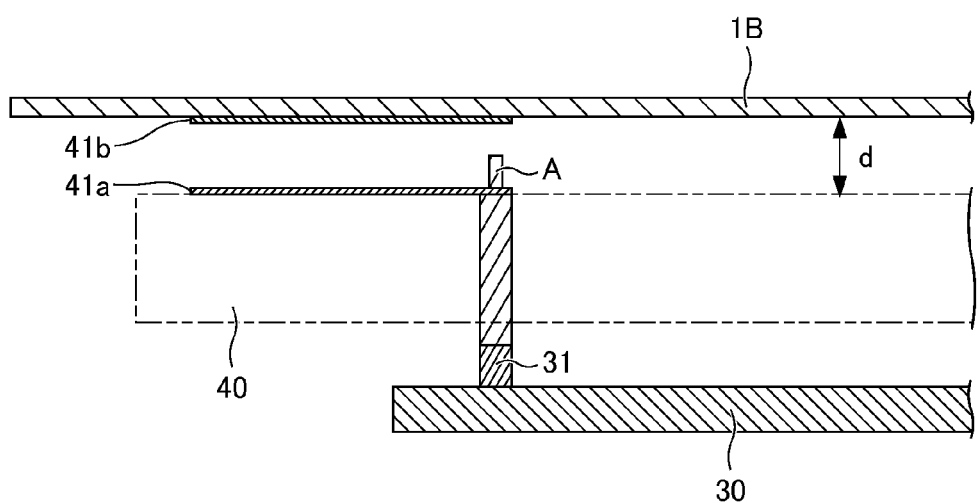
FIG. 23B is a cross-sectional view in which the second section is formed on the back face.

The second section 41*b* can be configured to be formed on the back face 1B side. A specific configuration is described with reference to FIGS. 23A and 23B. It should be noted that FIG. 23A is a perspective view taken from the circuit substrate 30 side (the rear case 40 is not illustrated). FIG. 23B is a cross-sectional view illustrating a state in which the second section 41*b* is formed on the back face 1B side.

The first section 41*a* is formed on the outer surface of the rear case 40. When the back face 1B is attached to the rear case 40, the inner surface of the back face 1B and the outer surface of the rear case 40 are spaced apart from each other by a predetermined distance d.

The second section 41*b* is formed by applying a conductive material on the inner surface of the back face 1B.

As illustrated in FIGS. 23A and 23B, a convex portion A is formed on the first section 41*a* such that the second section 41*b* is connected with the power supply unit 31 when the back face 1B is attached to the rear case 40. The convex portion A can be configured by a pogo pin type spring pin connector.

Accordingly, the smartphone 1, which forms the first section 41*a* on the rear case 40 and the second section 41*b* on the back face 1B, can form the antenna element 41 without being restricted by the surface shape of the rear case 40.

Figure 24:
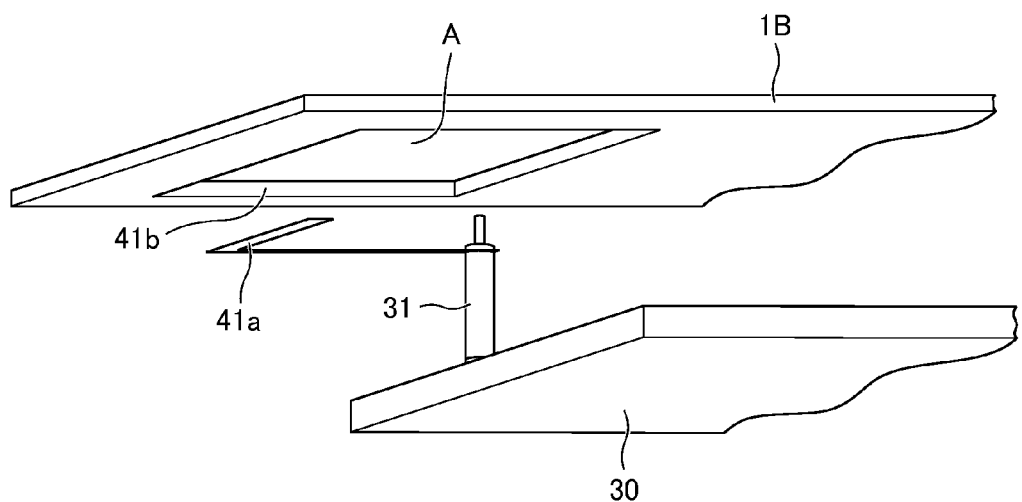
FIG. 24 is a diagram in which the second section is configured as a slot antenna.

In addition, if the back face 1B is metal, the second section 41*b* can also be configured as a slot antenna. A specific configuration is described with reference to FIG. 24. It should be noted that FIG. 24 is a perspective view taken from the circuit substrate 30 side (the rear case 40 is not illustrated).

An opening for exposing an electronic component provided in the rear case 40 is formed on the back face 1B. The electronic component is, for example, the camera 12.

The second section 41*b* is formed by applying a conductive material on an area (an area A in FIG. 24) surrounding the opening on the back face 1B. The surrounding area overlaps with the first section 41a in a thickness direction of the dielectric body or the insulating body. An edge portion that forms the area surrounding the opening in the second section 41b is supplied with electrical power by the power supply unit 31 and operates as a slot antenna.

Accordingly, the smartphone 1 can make the opening, which is provided to expose the camera 12 and the like, function as a slot antenna.

According to the present disclosure, upon forming an antenna element on the surface of a base material or a casing, restrictions imposed on formation of the antenna element can be reduced.

The invention claimed is:

1. An electronic device, comprising:
   a casing;
   a cover attached to the casing;
   an antenna element; and
   a power supply unit configured to supply electrical power to the antenna element;
   wherein
   the antenna element includes a first section of a conductive material on a first principal surface of the casing, and a second section,
   a dielectric body or an insulating body is interposed between the first section and the second section, and
   the power supply unit is in physical contact with the second section from below in a thickness direction of the casing,
   the first section is formed on an outer surface of the casing,
   an inner surface of the cover is spaced apart from the outer surface of the casing at a predetermined distance, and
   the second section includes a conductive material on the inner surface of the cover,
   an opening for exposing an electronic component provided in the casing is formed on the cover,
   the second section includes the conductive material on an area surrounding the opening on the cover,
   the surrounding area overlaps the first section in a thickness direction of the dielectric body or the insulating body, and
   the second section includes an edge portion that forms the area surrounding the opening, and
   the power supply unit is configured to supply electrical power to the edge portion to cause the edge portion to operate as a slot antenna.

2. The electronic device according to claim 1, wherein
   the casing includes the dielectric body or the insulating body,
   the first section is formed on the first principal surface of the casing, and
   the second section is formed on a second principal surface which is on an opposite side to the first principal surface across the casing.

3. The electronic device according to claim 2, further comprising a connecting unit, wherein
   the casing includes a through hole which communicatively connects the first principal surface with the second principal surface,
   the connecting unit which electrically connects a first end of the first section with a first end of the second section is disposed in the through hole, and
   the power supply unit is in physical contact with a second end of the second section from below, said second end of the second section being opposite to the first end of the second section in a direction perpendicular to the thickness direction of the casing.

4. The electronic device according to claim 2, further comprising a connecting unit, wherein
   the casing includes a through hole which communicatively connects the first principal surface with the second principal surface,
   the connecting unit which electrically connects a first end of the first section with a first end of the second section is disposed in the through hole, and
   the power supply unit is in physical contact with the first end of the second section from below.

5. The electronic device according to claim 4, wherein
   the first principal surface is the outer surface of the casing,
   the second principal surface is an inner surface of the casing,
   the second section overlaps the first section in the thickness direction of the casing, and
   the first section has a length smaller than a length of the second section.

6. The electronic device according to claim 2, wherein the first section includes a conductive adhesive that binds the casing with other members.

7. The electronic device according to claim 1, wherein
   a surface of the first section is covered by the dielectric body or the insulating body, and
   the second section includes the conductive material on the dielectric body or the insulating body.

8. The electronic device according to claim 7, wherein
   a first end of the first section is connected with the power supply unit and is opposite to a second end of the first section in a direction perpendicular to the thickness direction of the casing,
   the second section is a passive element,
   a first end of the second section is connected with the casing and is opposite to a second end of the second section in the direction perpendicular to the thickness direction of the casing, and
   a second end of the first section and a second end of the second section are facing each other across the dielectric body or the insulating body.

9. An electronic device, comprising:
   a casing;
   an antenna element;
   a power supply unit configured to supply electrical power to the antenna element; and
   a cover attached to the casing,
   wherein
   the antenna element includes a first section of a conductive material on a first principal surface of the casing, and a second section, with a dielectric body or an insulating body being interposed between the first section and the second section,
   the first section is formed on an outer surface of the casing,
   when the cover is attached to the casing, an inner surface of the cover is spaced apart from the outer surface of the casing at a predetermined distance, and
   the second section includes a conductive material on the inner surface of the cover,
   an opening for exposing an electronic component provided in the casing is formed on the cover,
   the second section includes a conductive material on an area surrounding the opening on the cover,
   the surrounding area overlaps with the first section in a thickness direction of the dielectric body or the insulating body, and an edge portion that forms the area surrounding the opening in the second section is supplied with electrical power by the power supply unit and operates as a slot antenna.

* * * * *